(12) United States Patent
Furihata et al.

(10) Patent No.: US 6,383,944 B1
(45) Date of Patent: May 7, 2002

(54) MICROPATTERNING METHOD

(75) Inventors: Tomoyoshi Furihata; Hideto Kato, both of Usui-gun; Satoshi Okazaki, Nakakubiki-gun, all of (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 09/417,088

(22) Filed: Oct. 13, 1999

(30) Foreign Application Priority Data

Oct. 16, 1998 (JP) ............................................ 10-314083

(51) Int. Cl.$^7$ ............................................ H01L 21/302

(52) U.S. Cl. ........................ 438/725; 438/719; 438/694; 216/40; 430/5

(58) Field of Search ............................. 430/5; 438/725, 438/719, 694; 216/40

(56) References Cited

U.S. PATENT DOCUMENTS 4,659,650 A * 4/1987 Moritz et al. ................ 430/313
5,118,584 A * 6/1992 Evans et al. ................. 430/313

FOREIGN PATENT DOCUMENTS

| JP | 54-078668 | * | 6/1979 |
| JP | 06-267843 | * | 9/1994 |
| JP | 07-161711 | * | 6/1995 |

* cited by examiner

*Primary Examiner*—George Goudreau
(74) *Attorney, Agent, or Firm*—Millen, White, Zelano & Branigan, P.C.

(57) ABSTRACT

By forming a lift-off resist pattern on a surface of a first layer, forming a second layer over the first layer surface including the resist pattern, removing the resist pattern to partially expose the first layer surface, and etching the exposed area of the first layer, a micropattern having a high resolution of 0.3 μm or less and improved dimensional control is obtained.

16 Claims, 2 Drawing Sheets

MICROPATTERNING METHOD

This invention relates to a micropatterning method using a resist composition designed to lend itself to the lift-off procedure.

BACKGROUND OF THE INVENTION

The recently increasing degree of integration in semiconductor devices requires a method capable of forming at high precision a pattern having an extremely small line width of less than 0.3 μm. The demand for high integration can be met by increasing resolution or optimizing a resist composition. In connection with the resolution increasing technology, studies have been made on the exposure method having incorporated therein ultrahigh resolution techniques such as modified illumination and phase shifting in compliance with the increased numerical aperture and reduced wavelength. With respect to the resist composition, a change from i-line sensitive novolac compositions to chemical amplification systems is made to match with the reduced wavelength of light sources.

However, with respect to the control of line width, the performance level of positive novolac resist compositions to be exposed to g and i-lines has not been fully reached.

SUMMARY OF THE INVENTION

An object of the invention is to provide a novel and improved micropatterning method capable of processing to a controlled line width of less than 0.3 μm while taking advantage of a positive novolac resist composition to be exposed to g and i-lines.

The invention provides a micropatterning method comprising the steps of forming a lift-off resist pattern on a surface of a first layer, forming a second layer over the first layer surface including the resist pattern, removing the resist pattern to partially expose the first layer surface, and etching the exposed area of the first layer. The micropatterning method of the invention has the advantages of a high resolution of 0.3 μm or less and improved dimensional control.

DESCRIPTION OF THE PREFERRED EMBODIMENTS

In the micropatterning method of the invention, a lift-off resist pattern is first formed on a surface of a first or base layer, a second layer is then formed over the first layer surface including the resist pattern, the resist pattern is lifted off to partially expose the first layer surface, and finally, the exposed area of the first layer is etched.

The first or base layer used herein may be a metal substrate such as a silicon substrate which optionally has formed thereon a metal layer such as a copper or aluminum layer or an organic layer such as a resist layer. The material of which the resist layer involved in the first layer is made may be a commercially available one such as SIPR-9351 from Shin-Etsu Chemical Co., Ltd. When the metal or organic layer is formed on the metal substrate, the overlay preferably has a thickness of 0.5 to 20 μm, especially 1 to 10 μm.

Figure 1:
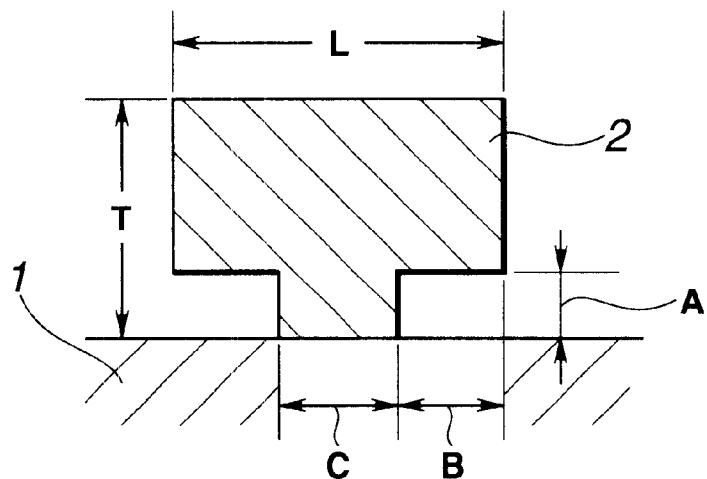
FIG. 1 schematically illustrates in cross-section a micropatterning method, showing the state after a resist pattern is formed on a first layer.

As shown in FIG. 1, a lift-off resist pattern is formed on one surface of the first layer 1. The resist pattern includes undercut line sections, one of which is depicted at 2 in FIG. 1. Each line section at its root has undercut zones extending along transversely opposed edges thereof. The resist pattern can be formed by a dual-layer resist process or a single-layer resist process using a novolac resist composition. As long as appropriate undercuts are formed, there may be used any desired resist composition, for example, a commercially available one such as SIPR-9691 from Shin-Etsu Chemical Co., Ltd.

More particularly, the resist composition is applied to form a resist film, which is baked at a temperature of 90 to 130° C. prior to exposure or development or both because undercuts are more effectively created. The resist film is then exposed and developed in a conventional manner.

For exposure, such radiation as i-line (365 nm), h-line (405 nm), g-line (436 nm) or broad band may be used.

Appropriate developers used herein are aqueous solutions of organic alkalis such as tetramethylammonium hydroxide and aqueous solutions of inorganic alkalis such as sodium hydroxide, potassium hydroxide and potassium meta-borate.

As shown in FIG. 1, the line section 2 of the lift-off resist pattern has a line width of L μm and a thickness of T μm. Each undercut has a penetration height of A μm and a penetration depth of B μm. The root of the line section 2 interposed between the undercuts has a width of C μm in contact with the first layer (C=L−2B). In one preferred embodiment, these parameters are in the following ranges. The line width L is from 0.1 to 10 μm, and especially 0.1 to 7 μm. The line thickness T is 0.5 to 20 μm, and especially 1 to 5 μm. The undercut height A is 0.05 to 2.0 μm, and especially 0.1 to 1.0 μm. The undercut depth B is 0.05 to 3.0 μm, and especially 0.1 to 1.0 μm. The root width C (=L−2B) is 0.05 to 9.5 μm, and especially 0.1 to 5.0 μm. Further, T, A and B satisfy the following relationship.

$0.05 \leq A/T \leq 0.4$, especially $0.1 \leq A/T \leq 0.2$ $0.05 \leq A/B \leq 4$, especially $0.25 \leq A/B \leq 2$ If A/T is outside the above range, the lift-off resist pattern would become less smooth to lift off. If A/B is outside the above range, the second layer would become inferior in dimensional control after removal of the resist (as will be described later).

Figure 2:
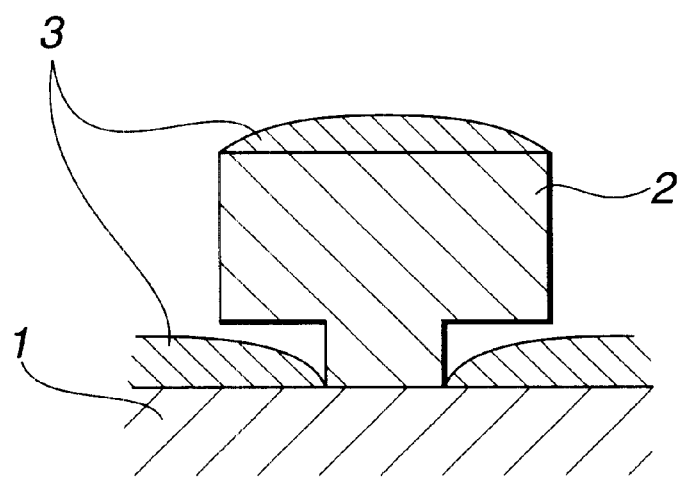
FIG. 2 schematically illustrates the state after a second layer is deposited thereon.

Next, as shown in FIG. 2, a second layer 3 is formed over the entire surface of the first layer 1 including the lift-off resist pattern 2. For the second layer, metals such as aluminum, copper and gold may be used. The second layer may be formed by gas phase deposition methods such as sputtering, vacuum evaporation and ion plating. The second layer may have an appropriate thickness although a thickness of 0.01 to 1.0 μm, and especially 0.05 to 0.2 μm is preferred. As seen from FIG. 2, the second layer 3 deposits on top of the resist pattern 2 and the exposed area of the first layer 1 and spreads into the undercuts as well.

Figure 3:
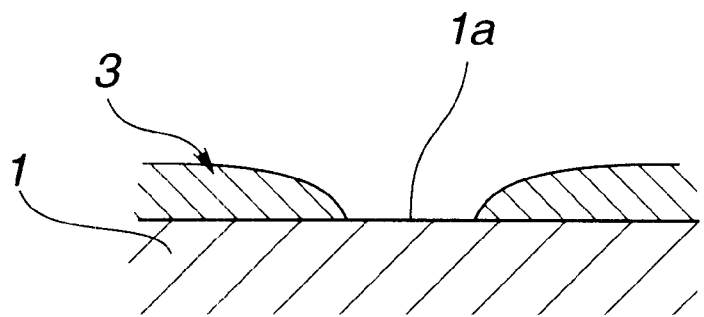
FIG. 3 schematically illustrates the state after the resist pattern has been peeled off.

Next, as shown in FIG. 3, the lift-off resist pattern 2 is removed using a stripping solution such as SIPR-NMP from Shin-Etsu Chemical Co., Ltd. The second layer 3 is left behind on the first layer 1 while the area 1a of the first layer 1 surface which has been covered with the resist pattern is exposed.

Figure 4:
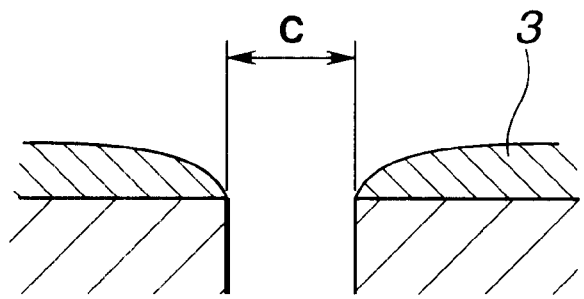
FIG. 4 schematically illustrates the state after etching.

Finally, the exposed area 1a of the first layer 1 is etched as shown in FIG. 4. To this end, dry etching with an oxygen plasma (known as oxygen reactive-ion etching $O_2$RIE) is carried out on the first layer 1 using the second layer 3 as a mask, thereby etching the first layer 1 to a desired shape. When the first layer 1 is an organic layer, the shape of the first layer being etched can be controlled in terms of the oxygen gas pressure ($P_{O2}$) of $O_2$RIE. For a rectangular profile having a high aspect ratio, a relatively low oxygen pressure ($P_{O2}$<several mTorr) is desirable. With a relatively high oxygen pressure ($P_{O2}$<several 10 mTorr), a tapered shape can be etched. When the first layer is a metal layer, the etched shape can be similarly controlled by a choice of an etching gas having a selectivity between the layers 1 and 3.

Referring to FIG. 1 again, the line width L is about 0.4 μm to about 0.5 μm which is equal to the conventional resolution achieved with g or i-line. The finally worked size is the size C in FIGS. 1 and 4, that is, the size of the resist of the lift-off configuration in contact with the substrate or first layer. The size C can be worked to 0.3 μm or less. That is, a micropattern can be processed with the advantages of high resolution and improved dimensional control. The micropatterning method of the invention can process to a controlled line width of 0.3 μm or less while taking advantage of a positive novolac resist composition which can be exposed to g and i-lines.

The micropatterning method using a resist pattern of the lift-off configuration can follow the novolac type resist process, use as the light source such radiation as i-line (365 nm), h-line (405 nm), g-line (436 nm) or broad band, and form a micropattern having a high resolution of 0.3 μm or less and improved dimensional control.

EXAMPLE

Examples of the invention are given by way of illustration and not by way of limitation.

On a silicon wafer, SIPR-9351 (Shin-Etsu Chemical Co., Ltd.) was spin coated as a first layer to a thickness of 3 μm and baked at 130° C. for 30 minutes, then at 180° C. for 90 minutes. This is designated "hard baked SIPR-9351."

Next, SIPR-9691 (single-layer positive novolac liftoff resist by Shin-Etsu Chemical Co., Ltd.) as a resist composition capable of forming the lift-off configuration was spin coated onto the hard baked SIPR-9351 to a thickness of 1 μm and pre-baked at 90° C. for 90 seconds.

Using an i-line stepper (NSR-1755i7A by Nikon K.K.), the resist film was exposed in a line-and-space pattern at an exposure of 150 mJ. It was post-exposure baked at 110° C. for 90 seconds and developed for 50 seconds with a 2.38% aqueous solution of tetramethylammonium hydroxide. In this way, a line-and-space pattern of SIPR-9691 was formed on the hard baked SIPR-9351.

The thus obtained lift-off resist pattern had the following dimensions.

L=0.45 μm
T=1 μm
A=0.2 μm
B=0.13 μm
C=0.2 μm
A/T=0.2
A/B=1.54

The root of the lift-off resist profile SIPR-9691 in contact with the hard baked SIPR-9351 had a size of 0.2 μm.

Next, by using a sputtering system L-313S-FHL (Anerba K.K.) and operating it at a vacuum of $5.0\times10^{-5}$ Pa, an argon flow of 3.5 sccm for 90 seconds, a DC discharge power of 500 W, aluminum was sputtered on the line-and-space pattern to a thickness of 1,000 Å. Using a stripping solution SIPR-NMP (Shin-Etsu Chemical Co., Ltd.), the resist pattern (SIPR-9691) was lifted off.

After the removal of the resist pattern, etching was carried out using a parallel plate type RIE apparatus. That is, the hard baked SIPR-9351 was etched for 20 to 30 minutes by $O_2$RIE under conditions: $O_2$ pressure 3 mTorr and RF power 0.64 mW/cm² (7 MHz) while the aluminum layer served as a mask. As a result, a micropattern having a C size of 0.23 μm as shown in FIG. 4 was obtained.

Japanese Patent Application No. 10-314083 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A micropatterning method comprising:
   forming a lift-off resist pattern having undercut line sections on a surface of a first layer,
   forming a second layer over the first layer surface including the resist pattern wherein the second layer spreads into the undercut line sections,
   removing the resist pattern to partially expose the first layer surface, and
   etching the exposed area of the first layer.

2. A micropatterning method as in claim 1, wherein the lift-off resist pattern has a width of L μm and a thickness of T μm and an undercut with a height of A μm and a depth of B μm, which satisfy the following relationship:
   $0.05 \leq A/T \leq 0.4$, and
   $0.05 \leq A/B \leq 4$.

3. A micropatterning method as in claim 2 wherein
   $0.1 \leq A/T \leq 0.2$ and
   $0.25 \leq A/B \leq 2$.

4. A micropatterning method as in claim 2, wherein
   L=0.1 to 10 μm,
   T=0.5 to 20 μm,
   A=0.05 to 2.0 μm, and
   B=0.05 to 3.0 μm.

5. A micropatterning method as in claim 2, wherein
   L=0.1 to 7 μm,
   T=1 to 5 μm,
   A=0.1 to 1.0 μm, and
   B=0.1 to 1.0 μm.

6. A micropatterning method as in claim 2, wherein L−2B is C which is 0.5 to 9.5 μm.

7. A micropatterning method as in claim 2, wherein L−2B is C which is 0.1 to 5.0 μm.

8. A micropatterning method as in claim 2, wherein L−2B is C which is less than 0.3 μm.

9. A micropatterning method as in claim 1, wherein the lift-off resist pattern is formed by a dual- or single-layer resist process using a novolac resist composition.

10. A micropatterning method as in claim 9, wherein the novolac resist composition is applied to form a resist film which is baked, then exposed to radiation of i-line which is 365 μm, h-line which is 405 μm, g-line which is 436 μm, or broad band.

11. A micropatterning method as in claim 1, wherein the second layer is formed by gas phase deposition.

12. A micropatterning method as in claim 1, wherein the second layer is aluminum, copper, or gold.

13. A micropatterning method as in claim 1, wherein the second layer has a thickness of 0.01 to 1.0 $\mu$m.

14. A micropatterning method as in claim 1, wherein the second layer has a thickness of 0.05 to 0.2 $\mu$m.

15. A micropatterning method as in claim 1, wherein the resist pattern is removed by a stripping solution.

16. A micropatterning method as in claim 1, wherein the exposed area is etched by dry etching with an oxygen plasma.

\* \* \* \* \*